United States Patent [19]

Au

[11] 4,380,709
[45] Apr. 19, 1983

[54] SWITCHED-SUPPLY THREE-STATE CIRCUIT

[75] Inventor: Kenneth K. Au, Round Rock, Tex.

[73] Assignee: Motorola, Inc., Schaumburg, Ill.

[21] Appl. No.: 150,019

[22] Filed: May 15, 1980

[51] Int. Cl.³ .................... H03K 19/094; H03K 19/20
[52] U.S. Cl. .................................. 307/473; 307/450; 307/475
[58] Field of Search .............. 307/443, 450, 473, 474, 307/475

[56] References Cited

U.S. PATENT DOCUMENTS

| | | | |
|---|---|---|---|
| 3,845,328 | 10/1974 | Hollingsworth | 307/473 |
| 3,906,255 | 9/1975 | Mensch, Jr. | 307/473 X |
| 3,912,947 | 10/1975 | Buchanan | 307/473 X |
| 4,037,114 | 7/1977 | Stewart et al. | 307/473 |
| 4,280,065 | 7/1981 | Minato et al. | 307/473 |

OTHER PUBLICATIONS

Cook et al., "Comparison of MOSFET Logic Circuits;" *IEEE-JSSC;* vol. SC-8, No. 5, pp. 348-355; 10/1973.
Kraft et al., "Tristale Driver Utilizing Bipolar-Complementary Metal-Oxide Semiconductor Technology," *IBM Tech. Discl. Bull.;* vol. 16, No. 8, pp. 2677-2678; 1/1974.

*Primary Examiner*—Larry N. Anagnos
*Attorney, Agent, or Firm*—Anthony J. Sarli, Jr.; Vincent B. Ingrassia; Robert L. King

[57] ABSTRACT

An MOS switched-supply three-state buffer circuit includes first and second inverter means. When an enabling signal is in the predetermined state, a source voltage is applied to the first and second inverter means to permit the generation of true and complement signal representations of an input signal. When the enabling signal is in other than a predetermined state, the source voltage is blocked and the circuit output is left floating.

9 Claims, 5 Drawing Figures

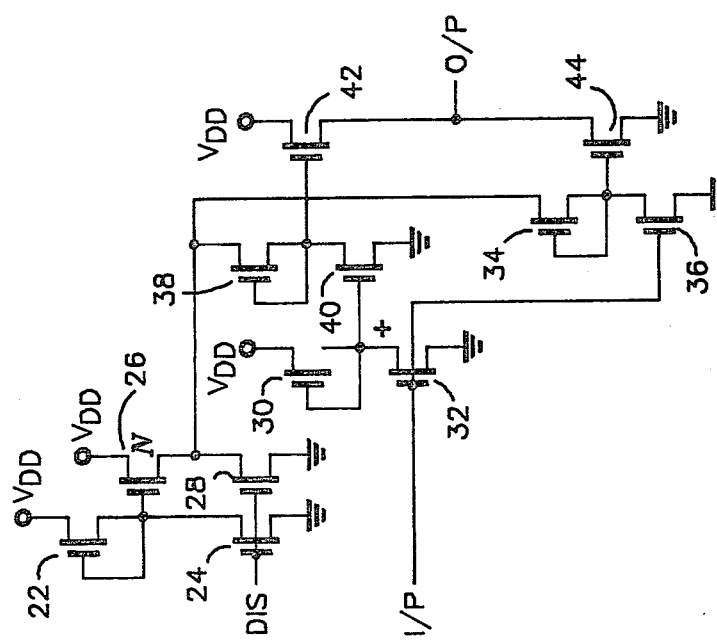
FIG. 2A
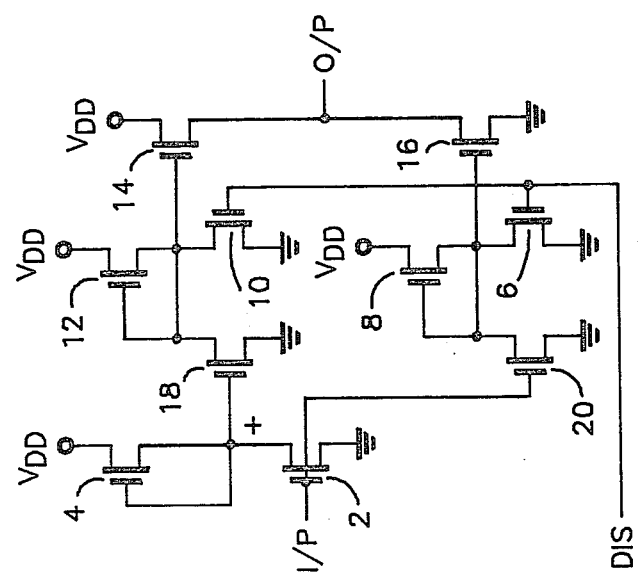
FIG. 1A — PRIOR ART —

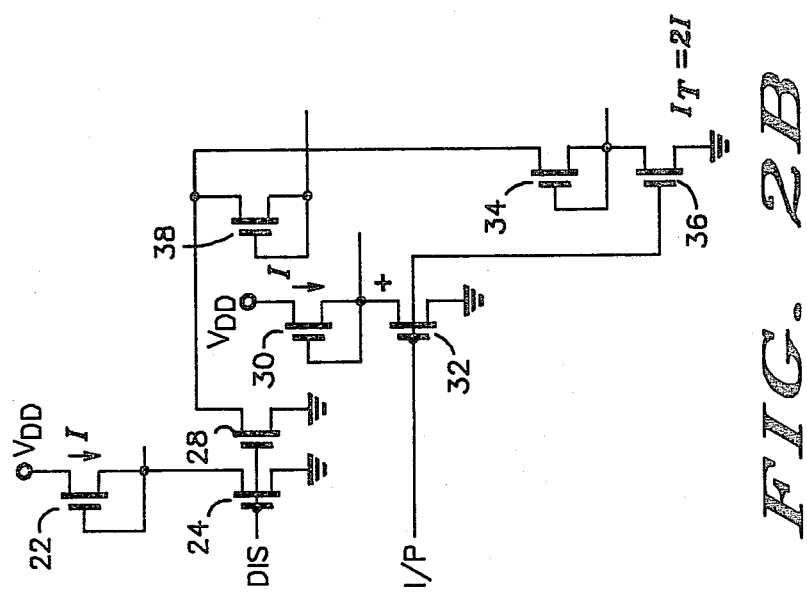
FIG. 2B
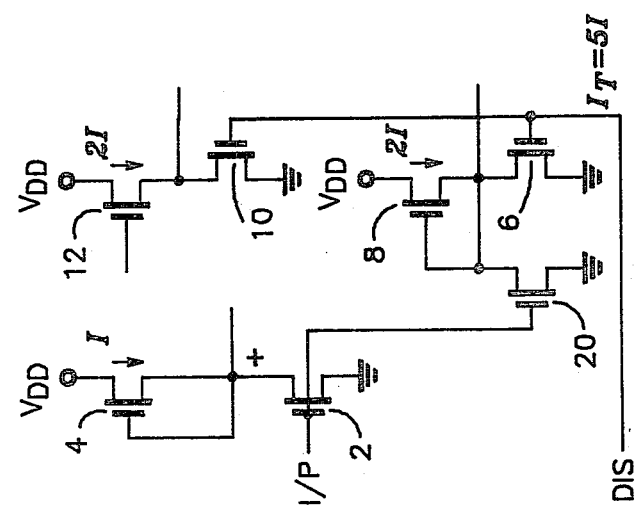
FIG. 1B — PRIOR ART —

SWITCHED-SUPPLY THREE-STATE CIRCUIT

BACKGROUND OF THE INVENTION

1. Field of the Invention

This invention relates generally to three-state circuits, and more particularly, to an MOS switched-supply three-state circuit.

2. Description of the Prior Art

The advantages offered by NMOS technology are well known; e.g. higher density, greater yield, etc. The smaller NMOS device geometries permit a greater number of devices to be produced per unit area or, stated another way, a single device will occupy less space. This characteristic is extremely important in the design or fabrication of complex digital integrated circuits; for example, single chip microprocessors. However, if progress is to continue, further improvements in density, yield, speed and power consumption must be achieved.

SUMMARY OF THE INVENTION

It is an object of the present invention to provide an improved three-state circuit.

It is the further object of the invention to provide an improved MOS three-state circuit which occupies less semiconductor area and consumes less power.

It is a still further object of the invention to provide an improved MOS switched-supply three-state circuit.

Finally, it is an object of the present invention to provide an improved switched-supply three-state circuit suitable for use in random access memory (RAM) read/write amplifiers.

According to an aspect of the invention there is provided a switched-supply three-state circuit capable of assuming first, second and third conditions, comprising: first means for receiving an enabling signal and a source of supply voltage; second means for receiving an input signal; third means coupled to said first and second means and having an output for generating true and complement signal representations of said input signal when the source voltage is supplied to said third means, said output being in a floating condition when said source voltage is blocked from said third means; and fourth means coupled between said first means and said third means for supplying the source voltage to said third means when said enabling signal is in a first predetermined state.

The above and other objects, features and advantages of the present invention will be more clearly understood from the following detailed description taken in conjunction with the accompanying drawings.

BRIEF DESCRIPTION OF THE DRAWINGS

FIGS. 1A and 1B are schematic diagrams of a known MOS three-state circuit;

FIGS. 2A and 2B are schematic diagrams of an MOS three-state circuit in accordance with the present invention; and FIG. 3 is a schematic diagram of a write amplifier incorporating the three-state circuit shown in FIG. 2.

DESCRIPTION OF THE PREFERRED EMBODIMENT

Before embarking on a discussion of the circuits shown in FIGS. 1–3, it may be helpful to first establish definitions of the various devices used within the circuits. First, a three-state circuit is a circuit capable of assuming three stable states. These are a high state (typically 5 volts), a low state (typically 0 volts) and a high impedance or floating state. An N-Channel MOS enhancement field effect transistor is a device which is normally "off" and which is rendered conductive when a positive threshold voltage is applied to its gate electrode. An N-Channel depletion MOS field effect transistor is a device which is normally "on" with a negative threshold voltage applied to its gate electrode. Finally, an N-Channel natural MOS transistor is a lightly depleted device with a very negative threshold voltage. With the application of an appropriate substrate bias, the device becomes lightly enhanced with a very low positive threshold voltage. The latter condition represents the normal operating mode of the natural N-Channel MOS device.

FIG. 1A is a schematic diagram which illustrates a known three-state circuit. It comprises a first inverting stage which includes enhancement device 2 and depletion device 4, a second inverting stage which includes enhancement device 6 and depletion device 8 and a third inverter which includes enhancement device 10 and depletion device 12. Each of the first, second and third inverters are coupled between a source of supply voltage ($V_{DD}$) and ground. An output stage includes enhancement devices 14 and 16 coupled in series between $V_{DD}$ and ground. A first NOR device (enhancement device 18) has a source coupled to ground, a gate coupled to the output of the first inverter, and a drain coupled to the output of the third inverter and to the gate of enhancement device 14. A second NOR device (enhancement device 20) has a source coupled to ground and a drain coupled to the output of the second inverter and to the gate of enhancement device 16. An input signal (I/P) is supplied to the gates of devices 2 and 20. A disable signal (DIS) is supplied to the gates of devices 6 and 10 (the inputs of the second and third inverters). Finally, the circuit output (O/P) is taken from the source/drain junction of devices 14 and 16.

When the disable signal (DIS) is low, the output of the circuit shown in FIG. 1A (O/P) follows the input signal (I/P). For example, when DIS is low, devices 6 and 10 are maintained in an off state. If I/P is low, devices 2 and 20 are off. Devices 4 and 8 are depletion devices and are therefore normally on. Thus, a high voltage is applied to the gate of device 18 and to the gate of device 16, turning devices 16 and 18 on. With device 18 on, a low voltage appears at the gate of device 14 turning it off. With device 14 off and device 16 on, a low voltage appears at O/P. If, on the other hand, I/P were to assume a high state, devices 2 and 20 would be turned on. This would cause a low voltage to appear at the gate of device 18 and at the gate of device 16 turning these devices off. With device 18 off, a high voltage appears at the gate of device 14. With device 14 on and device 16 off, a high voltage appears at O/P. Thus, when DIS is low, the output O/P does in fact follow the input I/P.

If the disable signal (DIS) should go high, devices 6 and 10 would be turned on. This would cause a low voltage to appear at the gates of devices 14 and 16 maintaining each of them in an off state and rendering the output O/P floating.

FIG. 2A is a schematic diagram of a switched supply three-state circuit in accordance with the present invention. The circuit comprises an input switching stage including depletion device 22, enhancement devices 24 and 28, and natural device 26, a first inverter including depletion device 30 and enhancement device 32, a second inverter including depletion device 34 and enhancement device 36, a third inverter including depletion device 38 and enhancement device 40 and an output stage including enhancement devices 42 and 44. The series combinations of devices 22 and 24, 26 and 28, 30 and 32, and 42 and 44 are coupled between a source of supply ($V_{DD}$) and ground. The second and third inverters are coupled between the source/drain junction of devices 26 and 28 and ground. The disable signal (DIS) is coupled to the gates of enhancement devices 24 and 28, and the input signal (I/P) is coupled to the gates of enhancement devices 32 and 36. The circuit output (O/P) is taken off the source/drain junction of devices 42 and 44.

When the disable signal (DIS) is low, enhancement devices 24 and 28 of the input switching stage are maintained off. With device 24 off, a high voltage appears at the gate of natural transistor 26 turning it on causing a high voltage to appear at the drain of devices 34 and 38 in the second and third inverters. If, on the other hand, the disable signal (DIS) is high, devices 24 and 28 are turned on. This results in a low voltage at the drains of devices 34 and 38 in the second and third inverters. Thus, by controlling the enabling signal, the supply voltage is switched on and off at the drain of devices 34 and 38 in the second and third inverters. When the drains of devices 34 and 38 are at a high level, one of the second and third inverters is permitted to rise high depending upon the state of the input signal (I/P) so as to drive one of the devices in the output stage (42 or 44). When the disable signal (DIS) is high, the outputs of the second and third inverters are forced to a low state via devices 28, 34 and 38 keeping devices 42 and 44 off and rendering the output O/P in a floating condition. Any stored charge at the output of the second and third inverters is discharged to ground through depletion devices 36 and 40 which are operating in the linear region.

As is the case in the circuit in FIG. 1A, when the disable signal (DIS) is low, the output (O/P) follows the input (I/P). For example, if I/P is low, devices 32 and 36 are maintained off. Thus, a high voltage is applied to the gate of device 40 and to the gate of device 44 turning each of them on. With device 40 on, a low voltage is applied to the gate of device 42 turning it off. With device 42 off and device 44 on, a low voltage appears at the output (O/P). If on the other hand, input (I/P) is high, devices 32 and 36 are turned on. With device 36 on, a low voltage is supplied to the gate of device 44 turning it off. A low voltage is applied to the gate of device 40 turning it off and causing a high voltage to be applied to the gate of device 42 turning it on. With device 42 on and device 44 off, a high voltage appears at output O/P.

At first glance, it might appear that the switched supply three-state circuit shown in FIG. 2A is more complicated than the circuit of FIG. 1A. To appreciate the significant improvements inherent in the FIG. 2A circuit, one must first consider DC current drain of the two circuits in the quiescent "floating" state. Referring to FIGS. 1B and 2B, an arbitrary current value of I is assigned to the first inverter in FIG. 1A (devices 2 and 4) and the first inverter in FIG. 2A (devices 30 and 32). The second and third inverter stages have higher drive capabilities and therefore the current value of 2I is assigned to them. The output stage and output signal O/P in each circuit dissipate no DC current since the pull-up and pull-down devices are never on at the same time. The maximum DC current drain occurs when the input is high. As can be seen, when the input is high and when DIS is high, each of the first, second and third inverter stages in FIG. 1B have a DC path from the supply voltage to ground and the total current is 5I. However, the switched-supply three-state circuit shown in FIG. 2B has a high supply voltage applied to only the input stage (devices 22 and 24) and the first inverter stage (devices 30 and 32). Therefore, the total current is only 2I, a 60% improvement.

It can also be shown that the circuit in FIG. 2A requires substantially less silicon area than the circuit in FIG. 1A. If we assume that a channel width W is necessary to sink current I, then 2W is needed to sink 2I. Summing up the channel widths, excluding that required for the final push-pull stage (devices 14 and 16) it can be seen that the circuit in FIG. 1A requires a total channel width of 9W. The switched-supply three-state circuit shown in FIG. 2A requires only a total channel width of 7W. Thus, the switched-supply three-state circuit shown in FIG. 2A not only dissipates less power, but also occupies less space.

FIG. 3 illustrates one use of the inventive switched supply three-state circuit in a write amplifier. Devices which serve similar functions as those shown in FIG. 2A have been denoted with like reference numerals; however, in FIG. 3, the disable signal is replaced with a write enable signal (WE), the input signal (I/P) has been replaced with a data bus signal (DB), and the output devices 42 and 44 serve as true and complement pull down devices for the column sense lines (SL and $\overline{SL}$). Aside from these differences, the only other deviation is that the write enable signal is coupled to the gates of devices 24 and 26 instead of 24 and 28, and the source/drain junction of devices 22 and 24 is coupled to the gate of device 28 instead of to the gate of device 26. This is simply to assure that when the write enable signal goes high, the supply voltage is switched onto the drains of devices 34 and 38.

It is to be understood that the above description of a preferred embodiment is given by way of example only. Changes in form and details may be made by one skilled in the art without departing from the scope of the invention as defined by the appended claims.

I claim:

1. A switched-supply three-state circuit capable of assuming first, second and third conditions, comprising:
   first means for receiving an enabling signal and a source of supply voltage;
   second means for receiving an input signal;
   third means coupled to said first and second means and having an output for generating true and complement signal representations of said input signal when the source voltage is supplied to said third means, said output being disabled when said source voltage is blocked from said third means; and
   fourth means coupled between said first means and said third means for supplying the source voltage to said third means when said enabling signal is in a first predetermined state, comprising:
   first inverter means having a first MOS inverter coupled between ground and said source voltage and having an input coupled to said enabling signal and having an output;
   a first field-effect transistor having a drain coupled to said source voltage, a gate coupled to the output of said first MOS inverter and having a source coupled to said third means for supplying voltage thereto; and a second field-effect transistor having a source coupled to ground, a gate coupled to said enabling signal and a drain coupled to the source of said first field-effect transistor.

2. A circuit according to claim 1 wherein said third means comprises:

second inverter means having an input coupled to said input signal and energized by said fourth means for generating the true signal representation; and third inverter means having an input coupled to said input signal and energized by said fourth means for generating the complement signal representation.

3. A circuit according to claim 2 further including an output stage coupled to said second and third inverter means and to said source voltage for receiving said true and complement signal representations and generating therefrom a single-ended output capable of assuming first, second and floating states.

4. A circuit according to claim 3 wherein said single ended output is floating when said enabling signal is in a second predetermined state.

5. A circuit according to claim 2 wherein said second inverter means comprises:

a second MOS inverter having an input coupled to said input signal and having an output; and a third MOS inverter having an input coupled to the output of said second MOS inverter for generating said true signal representation.

6. A circuit according to claim 5 wherein said third inverter means comprises a fourth MOS inverter having an input coupled to said input signal and an output for generating the complement signal representation.

7. A circuit according to claim 6 wherein said second, third and fourth MOS inverters each comprise a series combination of first and second field-effect transistors and wherein said second inverter is coupled between ground and said source voltage directly and wherein said third and fourth inverters are each coupled between ground and said fourth means.

8. A circuit according to claim 7 wherein each of said first field-effect transistors is of the enhancement type and each of said second field-effect transistors is of the depletion type.

9. A switched-supply three-state circuit capable of assuming first, second and third conditions, comprising:

first means for receiving an enabling signal and a source of supply voltage;

second means for receiving an input signal;

third means coupled to said first and second means and having an output for generating true and complement signal representations of said input signal when the source voltage is supplied to said third means, said output being disabled when said source voltage is blocked from said third means; and fourth means coupled between said first means and said third means for supplying the source voltage to said third means when said enabling signal is in a first predetermined state, wherein:

said third means comprises:

first inverter means having an input coupled to said input signal and energized by said fourth means for generating the true signal representation and comprising a first MOS inverter having an input coupled to said input signal and having an output and a second MOS inverter having an input coupled to the output of said first MOS inverter for generating said true signal representation; and second inverter means having an input coupled to said input signal and energized by said fourth means for generating the complement signal representation and comprising a third MOS inverter having an input coupled to said input signal and an output for generating the complement signal representation; and said fourth means comprises:

a fourth MOS inverter coupled between ground and said source voltage and having an input coupled to said enabling signal and having an output;

a third field-effect transistor having a drain coupled to said source voltage, a gate coupled to the output of said fourth inverter and having a source coupled to said second and third inverters for supplying voltage thereto; and a fourth field-effect transistor having a source coupled to ground, a gate coupled to said enabling signal and a drain coupled to the source of said third field-effect transistor.

* * * * *